United States Patent
Yonehara et al.

(10) Patent No.: US 8,698,390 B2
(45) Date of Patent: Apr. 15, 2014

(54) ORGANIC ELECTROLUMINESCENT DEVICE AND ILLUMINATION APPARATUS

(75) Inventors: Toshiya Yonehara, Kanagawa-ken (JP); Keiji Sugi, Kanagawa-ken (JP); Daimotsu Kato, Tokyo (JP); Tomoaki Sawabe, Tokyo (JP); Tomio Ono, Kanagawa-ken (JP); Shintaro Enomoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/224,971

(22) Filed: Sep. 2, 2011

(65) Prior Publication Data
US 2012/0229020 A1 Sep. 13, 2012

(30) Foreign Application Priority Data
Mar. 8, 2011 (JP) ................. 2011-049900

(51) Int. Cl.
*H01J 1/62* (2006.01)
*H05B 33/00* (2006.01)

(52) U.S. Cl.
USPC .......................................... 313/504; 313/506

(58) Field of Classification Search
USPC ........ 313/504–506; 428/690, 900; 445/23–25
See application file for complete search history.

(56) References Cited

U.S. PATENT DOCUMENTS

| | | | |
|---|---|---|---|
| 2007/0063641 A1* | 3/2007 | Cok et al. | 313/506 |
| 2009/0146550 A1* | 6/2009 | Uehara | 313/504 |
| 2010/0181899 A1* | 7/2010 | Forrest et al. | 313/504 |
| 2011/0187264 A1* | 8/2011 | Yasuda et al. | 313/504 |
| 2011/0304265 A1* | 12/2011 | Ikegami et al. | 313/504 |

FOREIGN PATENT DOCUMENTS

| | | |
|---|---|---|
| JP | 07-240277 | 9/1995 |
| JP | 2007-201491 | 8/2007 |
| JP | 2007-242927 | 9/2007 |
| JP | 2008-021872 | 1/2008 |
| JP | 2010-147338 | 7/2010 |

OTHER PUBLICATIONS

You et al., "Refractive Index, Optical Bandgap and Oscillator Parameters of Organic Films Deposited by Vacuum Evaporation Technique," J. Vacuum 83 (2009) 984-988.*
Holzer et al., "Absorption and Emission Spectroscopic Characterization of Ir(ppy)3," J. Chem. Phys. 308 (2005) 93-102.*

(Continued)

*Primary Examiner* — Joseph L Williams
(74) *Attorney, Agent, or Firm* — Amin, Turocy & Watson, LLP

(57) ABSTRACT

According to one embodiment, an organic electroluminescent device includes a transparent electrode, a metal electrode, an organic light emitting layer and an intermediate layer. The transparent electrode is transmissive with respect to visible light. The metal electrode is reflective with respect to the visible light. The organic light emitting layer is provided between the transparent electrode and the metal electrode and is configured to emit light including a wavelength component of the visible light. The intermediate layer contacts the metal electrode and the organic light emitting layer between the organic light emitting layer and the metal electrode and is transmissive with respect to the visible light. A thickness of the intermediate layer is 60 nanometers or more and less than 200 nanometers. A refractive index of the organic light emitting layer to the visible light is higher than a refractive index of the intermediate layer to the visible light.

32 Claims, 8 Drawing Sheets

(56) References Cited

OTHER PUBLICATIONS

Reineke, Sebastian, et al., "White organic light-emitting diodes with flourescent tube efficiency", Nature, May 14, 2009, vol. 459, pp. 234-238.

European Search Report for Application No. 11180179.1 Dated Apr. 24, 2013, 5 pgs.

Japanese Office Action for Japanese Application No. 2011-049900 mailed Feb. 14, 2013.

Korean Office Action for Korean Application No. 2011-0090323 mailed Mar. 9, 2013.

Owen, Scott G. "CIE Chromaticity Diagram" ACM SIGGRAPH. Jun. 5, 1999. http://www.siggraph.org/education/materials/HyperGraph/color/colorcie.htm.

Korean Office Action for Korean Patent Application No. 10-2011-90323 mailed on Sep. 1, 2013.

Office Action of Notification of Reason(s) for Refusal for Japanese Patent Application No. 2011-049900 Dated Nov. 27, 2013, 3 pgs.

* cited by examiner

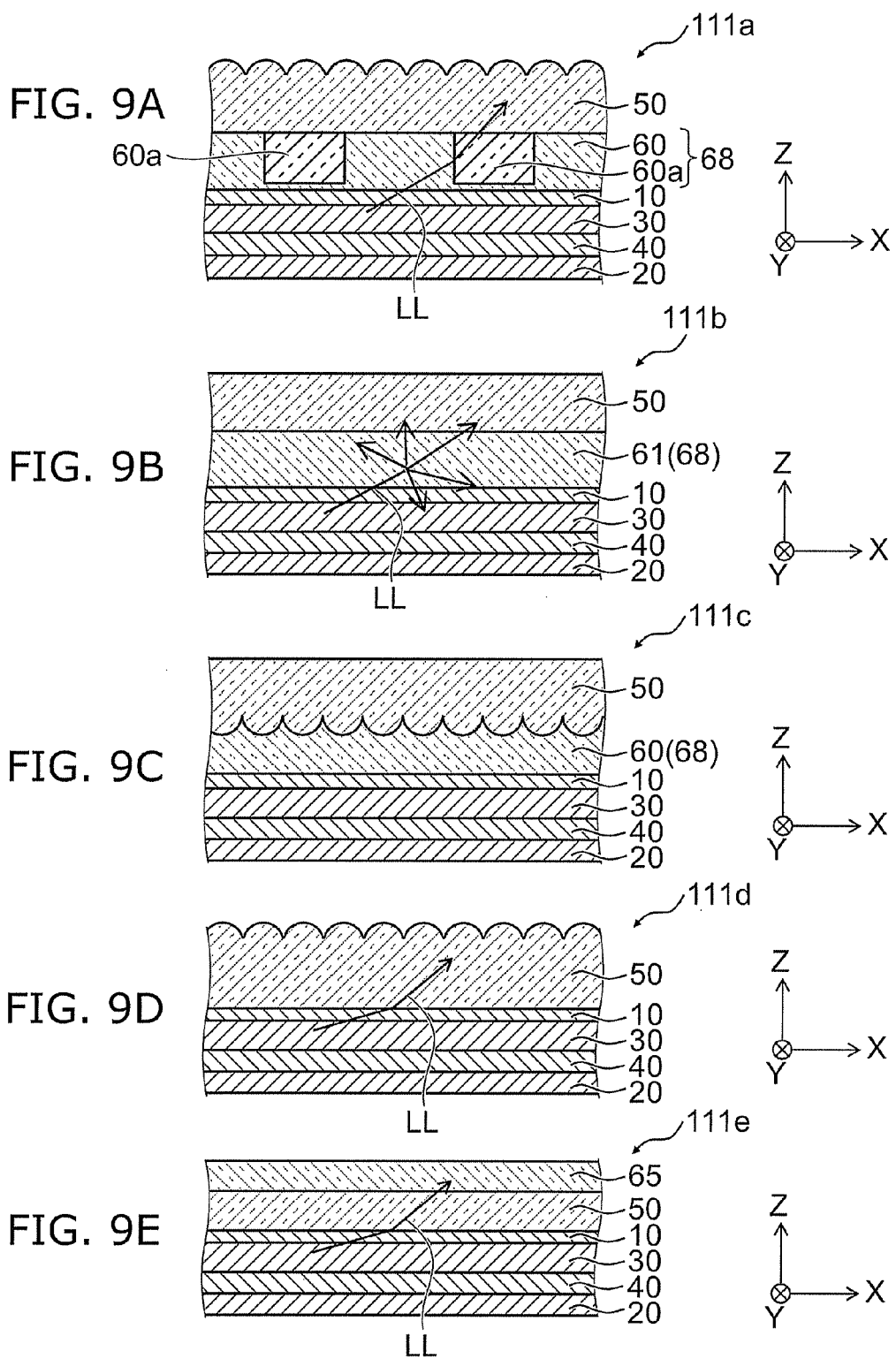

ORGANIC ELECTROLUMINESCENT DEVICE AND ILLUMINATION APPARATUS

CROSS-REFERENCE TO RELATED APPLICATIONS

This application is based upon and claims the benefit of priority from the prior Japanese Patent Application No. 2011-049900, filed on Mar. 8, 2011; the entire contents of which are incorporated herein by reference.

FIELD

Embodiments described herein relate generally to an organic electroluminescent device and an illumination apparatus.

BACKGROUND

An organic electroluminescent device includes an organic film between a cathode and an anode. A voltage is applied to these electrodes, and thus the organic film receives an electron injected from the cathode and a hole injected from the anode. This recombines the electron and the hole, and an exciton generated at the recombination is subjected to radiative deactivation causing light emission used for devices.

BRIEF DESCRIPTION OF THE DRAWINGS

FIG. 9A to FIG. 9E are schematic sectional views showing another organic electroluminescent device according to the embodiment.

DETAILED DESCRIPTION

Figure 1A:
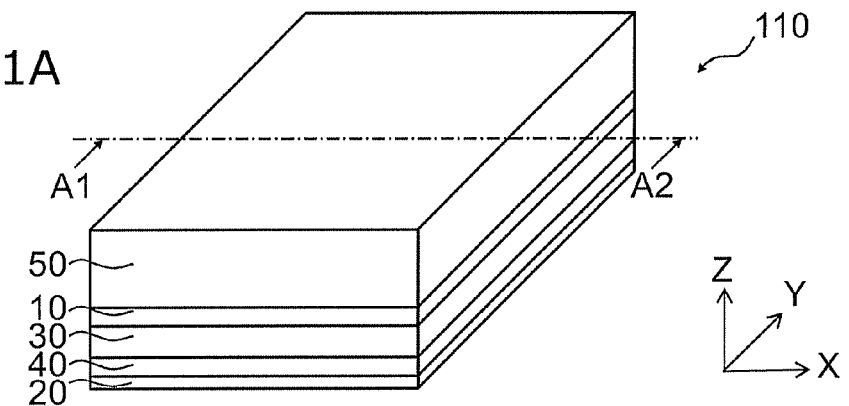
FIG. 1A to FIG. 1C are schematic views showing an organic electroluminescent device according to an embodiment.

In general, according to one embodiment, an organic electroluminescent device includes a transparent electrode, a metal electrode, an organic light emitting layer and an intermediate layer. The transparent electrode is transmissive with respect to visible light. The metal electrode is reflective with respect to the visible light. The organic light emitting layer is provided between the transparent electrode and the metal electrode and is configured to emit light including a wavelength component of the visible light. The intermediate layer contacts the metal electrode and the organic light emitting layer between the organic light emitting layer and the metal electrode and is transmissive with respect to the visible light. A thickness of the intermediate layer is 60 nanometers or more and less than 200 nanometers. A refractive index of the organic light emitting layer to the visible light is higher than a refractive index of the intermediate layer to the visible light.

In general, according to one embodiment, an illumination apparatus includes an organic electroluminescent device and a power supply. The organic electroluminescent device includes a transparent electrode, a metal electrode, an organic light emitting layer and an intermediate layer. The transparent electrode is transmissive with respect to visible light. The metal electrode is reflective with respect to the visible light. The organic light emitting layer is provided between the transparent electrode and the metal electrode and is configured to emit light including a wavelength component of the visible light. The intermediate layer contacts the metal electrode and the organic light emitting layer between the organic light emitting layer and the metal electrode and is transmissive with respect to the visible light. The power supply is connected to the transparent electrode and the metal electrode and is configured to supply a current flowing the organic light emitting layer. A thickness of the intermediate layer is 60 nanometers or more and less than 200 nanometers. A refractive index of the organic light emitting layer to the visible light is higher than a refractive index of the intermediate layer to the visible light.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
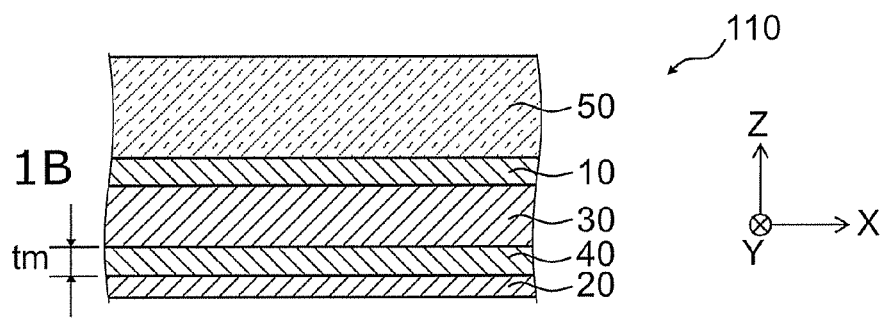
Figure 1C:
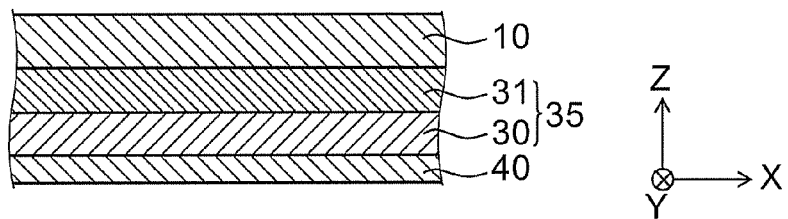

FIG. 1A to FIG. 1C are schematic views illustrating an organic electroluminescent device according to an embodiment.

FIG. 1A is a perspective view. FIG. 1B is a sectional view along A1-A2 line in FIG. 1A. FIG. 1C is a schematic sectional view illustrating the partial configuration of the organic electroluminescent device, and corresponds to the A1-A2 sectional view of FIG. 1A.

As shown in FIG. 1A and FIG. 1B, an organic electroluminescent device 110 includes a transparent electrode 10, a metal electrode 20, an organic light emitting layer 30 and an intermediate layer 40.

The transparent electrode 10 is transmissive to visible light. The metal electrode 20 is reflective with respect to the visible light. The organic light emitting layer 30 is provided between the transparent electrode 10 and the metal electrode 20. The organic light emitting layer 30 emits light including a wavelength component of the visible light. The intermediate layer 40 contacts the metal electrode 20 and the organic light emitting layer 30 between the organic light emitting layer 30 and the metal electrode 20. The intermediate layer 40 is transmissive with respect to the visible light.

Here, a direction from the metal electrode 20 toward the transparent electrode 10 is taken as a Z-axis direction (first direction). The Z-axis is taken as a first axis. One direction perpendicular to the Z-axis is taken as an X-axis (second axis). An axis perpendicular to the Z-axis and the X-axis is taken as a Y-axis (third axis).

In this example, the organic electroluminescent device 110 further includes a transparent substrate 50. The transparent electrode 10 is disposed between the transparent substrate 50 and the organic light emitting layer 30. The transparent substrate 50 is transmissive with respect to the visible light.

For example, the transparent electrode 10 is provided on the transparent substrate 50. The organic light emitting layer is provided on the transparent electrode 10. The intermediate layer 40 is provided on the organic light emitting layer 30. The metal electrode 20 is provided on the intermediate layer 40.

As shown in FIG. 1C, the organic electroluminescent device 110 can further include a transparent electrode side functional layer 31. The transparent electrode side functional layer 31 is provided between the organic light emitting layer 30 and the transparent electrode 10. The organic light emitting layer 30 and the transparent electrode side functional layer 31 are included in an organic layer 35. The transparent electrode side functional layer 31 is provided as necessary.

The organic light emitting layer 30 can be made of, for example, a material such as $Alq_3$, F8BT and PPV. The organic light emitting layer 30 can be made of a mixed material including a host material and dopant added to the host material. The host material can be made of, for example, CBP, BCP, TPD, PVK and PPT. The dopant material can be made of, for example, FIrpic, $Ir(ppy)_3$ and FIr6 or the like.

The transparent electrode side functional layer 31 functions, for example, a hole injection layer. In this case, the transparent electrode side functional layer 31 can be made of, for example, PEDPOT:PPS, CuPc and $MoO_3$ or the like.

The transparent electrode side functional layer 31 functions, for example, a hole transport layer. In this case, the transparent electrode side functional layer 31 can be made of, for example, α-NPD, TAPC, m-MTDATA, TPD and TCTA or the like.

The transparent electrode side functional layer 31 may have a stacked structure made of a layer functioning as the hole injection layer and a layer functioning as the hole transport layer.

The intermediate layer 40 can include, for example, a layer functioning as an electron transport layer. The layer functioning as the electron transport layer can be made of, for example, $Alq_3$, BAlq, $POPy_2$, Bphen and 3TPYMB or the like.

The intermediate layer 40 may have a stacked structure made of a layer functioning as the electron transport layer and an electron injection layer provided between the layer and the metal electrode 20. The electron injection layer is a layer for improving electron injection characteristics. A thickness of the electron transport layer is, for example, approximately 1 nanometer (nm).

The transparent substrate 50 is, for example, a glass substrate.

The transparent electrode 10 includes oxide including at least one selected from the group consisting of In, Sn, Zn and Ti. The transparent electrode 10 is, for example, ITO (Indium Tin Oxide) film. The transparent electrode 10 functions, for example, as an anode.

The metal electrode 20 includes, for example, at least one of aluminum (Al), silver (Ag). The metal electrode 20 may be made of Mg:Ag (alloy of magnesium and silver). For example, the metal electrode 20 is made of an aluminum film. When the metal electrode 20 is made of the aluminum film, it gives particularly an advantage to productivity and cost. The metal electrode 20 functions, for example, as a cathode.

The intermediate layer 40 is, for example, an organic layer. The embodiment is not limited thereto, but the intermediate layer 40 may be an inorganic layer. The intermediate layer 40 may be made of a mixed material of the organic material and the inorganic material.

In the case where the intermediate layer 40 is formed on the organic layer 35, a condition of forming the intermediate layer 40 is set to a condition causing no degradation of the organic layer 35. When the intermediate layer 40 is formed of an organic material, the condition of forming the intermediate layer 40 (for example, temperature) is easy to be a mild condition. Thereby, the intermediate layer 40 is notable to include the organic material.

In the organic electroluminescent device 110, the light emitted from the organic light emitting layer 30 is extracted from a side of the transparent electrode 10 (side of the transparent substrate 50).

In the embodiment, a thickness of the intermediate layer 40 (thickness tm) is 60 nm or more and 200 nm or less. A refractive index ($n_1$) of the organic light emitting layer 30 to the visible light is higher than a refractive index ($n_2$) of the intermediate layer 40.

This provides an organic electroluminescent device having high light extraction efficiency (outcoupling efficiency).

Hereinafter, the characteristics of the organic electroluminescent device 110 will be described hereinafter with comparison with a comparative example.

Figure 2:
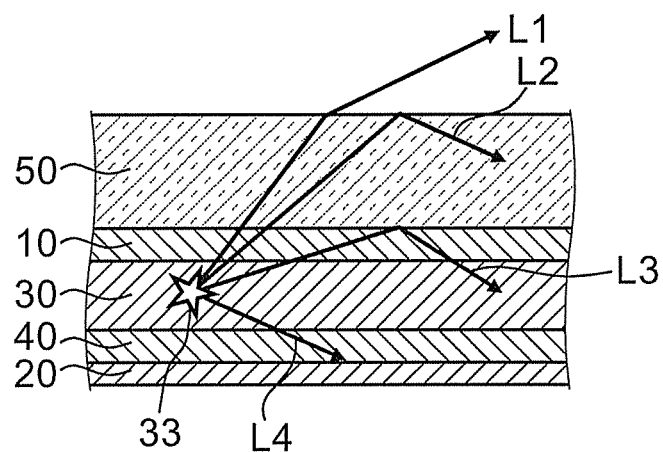
FIG. 2 is a schematic view showing the characteristics of the organic electroluminescent device.

FIG. 2 is a schematic view illustrating the characteristics of the organic electroluminescent device.

As shown in FIG. 2, in general, in an organic electroluminescent device, whereabouts of light (light source 33) generated in the organic light emitting layer 30 are basically classified into four components. That is, in the organic electroluminescent device, the light is classified into an external mode component L1, a substrate mode component L2, a thin film layer mode component L3 and a loss component L4 due to a metal. Hereinafter, "loss component L4 due to a metal" is only referred to as "loss component L4".

The external mode component L1 is a component extractable outside the organic electroluminescent device. The substrate mode component is a component reaching the transparent substrate 50 but not capable of getting out the transparent substrate 50. The thin film layer mode component L3 corresponds to a mode in which the light is closed in at least one thin film layer of the organic light emitting layer 30, the intermediate layer 40 and the transparent electrode 10. The loss component L4 is a component having a loss by the metal electrode 20.

Figure 3:
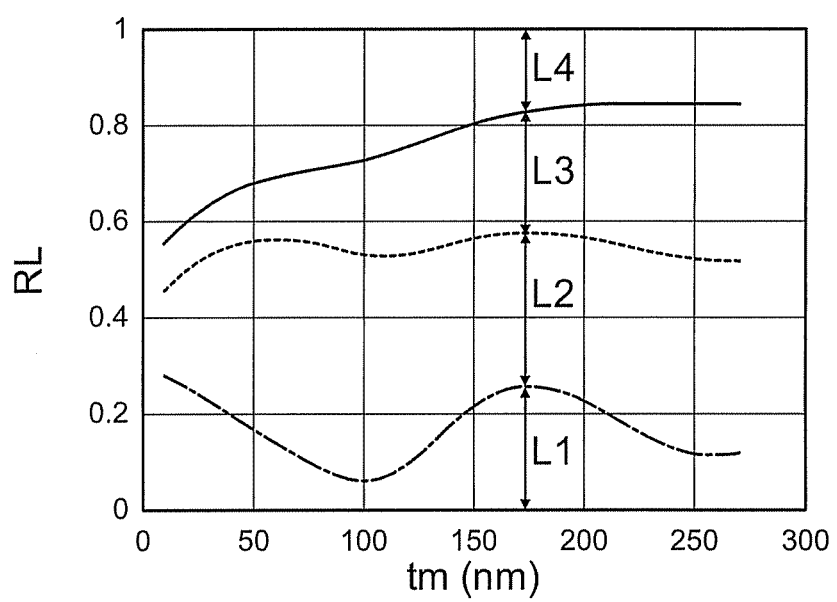
FIG. 3 is a graph showing the characteristics of the organic electroluminescent device.

FIG. 3 is a graph illustrating the characteristics of the organic electroluminescent device.

FIG. 3 shows an example of simulation results on distribution ratio RL of light energy. The horizontal axis of FIG. 3 represents the thickness tm of the intermediate layer 40. The vertical axis represents the distribution ratio RL.

This simulation makes a model of the organic EL device having a following configuration. In this model, assuming that the refractive index is n, the ITO film (thickness=100 nm) of substantially n=1.8, the hole injection layer (thickness=60 nm) of substantially n=1.6, the light emitting layer 30 (thickness=80 nm) of substantially n=1.8, the intermediate layer 40 (electron transport layer) (thickness=tm nanometers) of substantially n=1.8, and the metal electrode of Al (thickness=150 nm) are stacked in this order on the glass substrate (transparent substrate 50) of n=1.5. Here, "substantially" means use of refractive index including a wavelength dispersion of the refractive index of each material, and a value of the refractive index n in the above is a rough value.

As shown in FIG. 3, the external mode component L1, the substrate mode component L2, the thin film layer mode component L3 and the loss component L4 change depending on the thickness tm of the intermediate layer 40.

A configuration is conceived, in which a loss due to surface plasmon of the metal electrode 20 of the loss component L4 due to the metal electrode 20 is reduced. In this configuration, a distance between the organic light emitting layer 30 and the metal electrode 20 is conventionally set to 200 nm or more. That is, a loss at the cathode (plasmon loss) is considered to be ignored when the distance between a light emitting position and a cathode is 200 nm or more. For example, by setting the thickness of the electron transport layer in the organic electroluminescent device to 200 nm or more, the distance between the organic light emitting layer 30 and the metal electrode 20 is set to 200 nm or more. The distance between the organic light emitting layer 30 and the metal electrode 20 corresponds to, for example, the thickness tm of the intermediate layer 40.

As shown in FIG. 3, the loss component L4 becomes small in a region where the thickness of the electron transport layer (in FIG. 3, corresponding to the thickness tm of the intermediate layer 40) is thick to be 200 nm or more.

However, when the thickness of the electron transport layer is set thick, a large voltage drop occurs in the electron transport layer. As a result, in this configuration, a driving voltage of the organic electroluminescent device rises. That is, this configuration improves an external quantum efficiency of the organic electroluminescent device, but a power efficiency drops. Therefore, in this configuration, it is difficult to obtain a practical performance. At this time, in order to suppress the voltage drop, there is a method for improving the charge transfer ability in the electron transport layer by doping an alkaline metal or the like into the electron transport layer. Herewith, it is considered to suppress the driving voltage from rising and recover the power efficiency drop to some extent. However, the doping the alkaline metal or the like is practically difficult to adopt from the viewpoint of productivity and cost.

Further thickening of the electron transport layer leads to increase of the amount of materials to be used and increase of tact time in manufacturing. That is, the productivity also declines from the viewpoint of these problems.

On the contrary, in the organic electroluminescent device 110 according to the embodiment, the thickness tm of the intermediate layer 40 (distance between the organic light emitting layer 30 and the metal electrode 20) is set to 200 nm or less and the power efficiency drop due to the above voltage drop is suppressed. The high productivity is maintained.

In the embodiment, even when the thickness tm of the intermediate layer 40 (distance between the organic light emitting layer 30 and the metal electrode 20) is set to 200 nm or less, the configuration in which the loss due to the surface plasmon of the loss component L4 can be reduced is adopted. That is, the refractive index $n_1$ of the organic light emitting layer 30 to the visible light is set higher than the refractive index $n_2$ of the intermediate layer 40 to the visible light. This can reduce the loss due to the surface plasmon without occurrence of the voltage drop while maintaining the high productivity.

The reduction of the loss due to the surface plasmon in the embodiment is quantitatively related to that non-traveling light generated by the surface plasmon causes stimulated emission of a dipole serving as the light source 33 of the organic electroluminescent device.

For example, in the comparative example in which the refractive index of the intermediate layer 40 is higher than the refractive index of the organic light emitting layer 30 including the dipole being the light source 33, the non-traveling light generated by the surface plasmon keeps to be the non-traveling light also in the organic light emitting layer 30, even after transmitting the intermediate layer 40. As a result, the dipole is stimulated by the non-traveling light by the surface plasmon. Herewith, it is considered to cause unavailable light radiation in the organic electroluminescent device.

On the contrary, when the refractive index of the intermediate layer 40 is smaller than the refractive index of the organic light emitting layer 30, the non-traveling light generated by the surface plasmon comes to a traveling light after transmitting the intermediate layer 40 and entering the organic light emitting layer 30. This stimulates the dipole to the traveling light. Herewith, it is considered to provide available light radiation in the organic electroluminescent device.

In this manner, contrary to that the loss due to the surface plasmon is generally reduced by setting the thickness of the electron transport layer thick to 200 nm or more, the embodiment shows specifically the configuration, being capable of reducing the loss due to the surface plasmon even if setting the thickness tm of the intermediate layer 40 to 200 nm or less. This provides an organic electroluminescent device having high outcoupling efficiency.

More specifically, a complex dielectric constant $\in_M$ of the metal electrode 20, the refractive index $n_1$ of the organic light emitting layer 30 to the visible light, and the refractive index $n_2$ of the intermediate layer 40 to the visible light satisfy a relationship of $$n_2 \cdot Re[\{\in_M/((n_2)^2+\in_M)\}^{1/2}] < n_1 \quad (1).$$

Here, assuming $A1=\{\in_M/((n_2)^2+\in_M)\}^{1/2}$, $Re[\{\in_M/((n_2)^2+\in_M)\}^{1/2}]$, namely $Re[A1]$ is real part of $A1$.

Satisfying the formula (1) can reduce the loss due to the surface plasmon.

For example, the case of the metal electrode 20 made of aluminum, and the wavelength being 520 nm is supposed. At this time, an approximate value of the refractive index $n_{Al}$ of the metal electrode 20 is a following value.

$$n_{Al}=0.698+i*5.68$$

Here, i is imaginary unit. The complex dielectric constant $\in_M$ of the metal electrode 20 is as follows.

$$\text{complex dielectric constant } \varepsilon_M = (n_{A1})^2$$
$$= -31.8 + i*7.93$$

In the case where the refractive index $n_2$ of the intermediate layer 40 is 1.8.

$$Re[A1]=1.05$$

That is, in this condition, the formula (1) is as follows.

$$n_2 \cdot 1.05 < n_1$$

That is, the refractive index ($n_1$) of the organic light emitting layer 30 is set to 1.05 times or more of the refractive index ($n_2$) of the intermediate layer 40.

Figure 4:
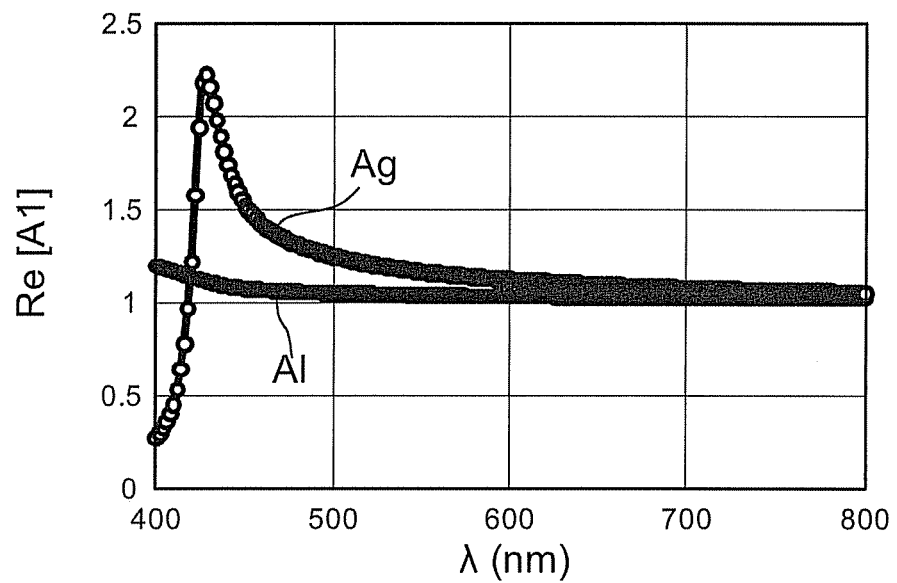
FIG. 4 is a graph showing the characteristics of the organic electroluminescent device according to the embodiment.

FIG. 4 is a graph illustrating the characteristics of the organic electroluminescent device according to the embodiment.

That is, FIG. 4 illustrates simulation results on the value of $Re[A1]$. The horizontal axis of FIG. 4 represents a wavelength. The vertical axis represents $Re[A1]$. This figure shows the cases of the metal electrode 20 made of aluminum (Al) and silver (Ag). The refractive index $n_{Al}$ of the metal electrode 20 in the case of aluminum is $n_{Al}=0.698+i*5.68$ as previously described. On the other hand, the refractive index $n_{Ag}$ of the metal electrode 20 in the case of silver is $n_{Ag}=0.130+i*3.10$. In this simulation, a value corresponding to the case where Alq$_3$ is used for the intermediate layer 40 is used as the refractive index $n_2$ of the intermediate layer 40.

As shown in FIG. 4, when Al is used for the metal electrode 20, Re[A1] is approximately a value of 1.02 or more and 1.20 or less in the wavelength range of the visible light. On the other hand, when Ag is used for the metal electrode 20, Re[A1] is approximately a value of 1.05 or more and 2.25 or less in the wavelength range of the visible light. Like this, the value of Re[A1] changes depending on the material used for the metal electrode 20.

Therefore, for example, in consideration of the value of Re[A1] changing based on the material used for the metal electrode 20, the relationship between the refractive index ($n_1$) of the organic light emitting layer and the refractive index ($n_2$) of the intermediate layer 40 is adequately set.

Figure 5:
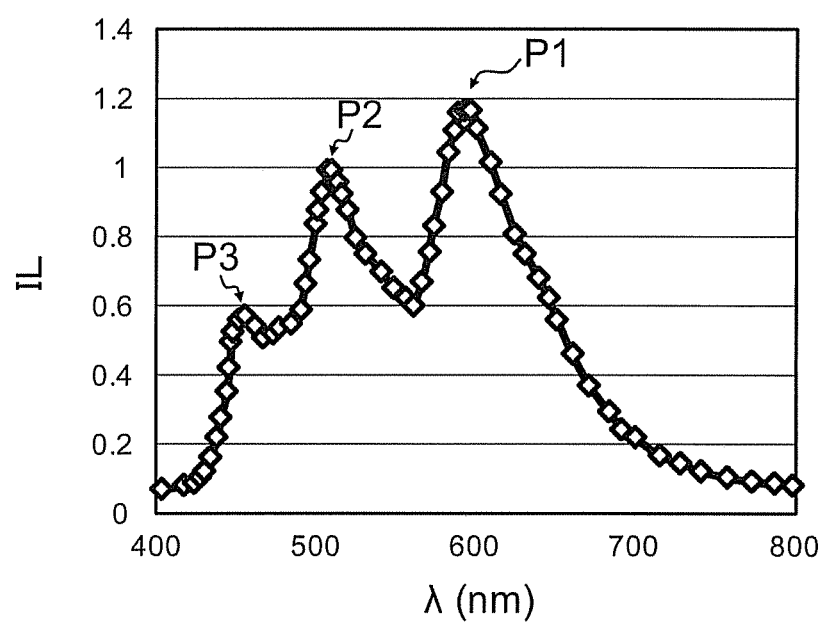
FIG. 5 is a graph showing the characteristics of the organic electroluminescent device according to the embodiment.

FIG. 5 is a graph illustrating the characteristics of the organic electroluminescent device according to the embodiment.

FIG. 5 shows an example of the wavelength characteristics of the light emitted from the organic light emitting layer 30. The horizontal axis represents the wavelength. The vertical axis represents light intensity IL (arbitrary unit).

As shown in FIG. 5, the light emitted from the organic light emitting layer 30 has a first peak P1 of a first wavelength and a second peak P2 of a second wavelength different from the first wavelength. The first wavelength is, for example about 600 nm, and the second wavelength is about 510 nm. The light emitted from the light emitting layer 30 can further have a third peak P3 of a third wavelength different from the first wavelength and the second wavelength. The third wavelength is, for example, about 450 nm. For example, light with the first wavelength, light with the second wavelength and light with the third wavelength are visible.

As shown in FIG. 5, the organic light emitting layer 30 emits "white color light". Here, the "white color light" is substantially white color and also includes, for example, light of white color such as red-based, yellow-based, green-based, blue-based and purple-based. The light emitted from the organic light emitting layer 30 can have multiple peaks. The refractive index of the organic light emitting layer 30 is set higher than the refractive index of the intermediate layer 40 in each of the multiple peaks.

That is, in the embodiment, the refractive index of the organic light emitting layer 30 at the first wavelength is higher than the refractive index of the intermediate layer 40 at the first wavelength. The refractive index of the organic light emitting layer 30 at the second wavelength is higher than the refractive index of the intermediate layer 40 at the second wavelength. Furthermore, the refractive index of the organic light emitting layer 30 at the third wavelength is higher than the refractive index of the intermediate layer 40 at the third wavelength.

For example, the complex dielectric constant $\in_M$ of the metal layer 20, a refractive index $n_{1a}$ of the organic light emitting layer 30 at the first wavelength, and a refractive index $n_{2a}$ of the intermediate layer 40 at the first wavelength satisfy a relationship of $$n_{2a} \cdot Re[\{\in_M/((n_{2a})^2+\in_M)\}^{1/2}] < n_{1a} \qquad (2).$$

The complex dielectric constant $\in_M$ of the metal layer 20, a refractive index $n_{1b}$ of the organic light emitting layer 30 at the second wavelength, and a refractive index $n_{2b}$ of the intermediate layer 40 at the second wavelength satisfy a relationship of $$n_{2b} \cdot Re[\{\in_M/((n_{2b})^2+\in_M)\}^{1/2}] < n_{1b} \qquad (3).$$

Furthermore, the complex dielectric constant $\in_M$ of the metal layer 20, a refractive index $n_{1c}$ of the organic light emitting layer 30 at the third wavelength, and a refractive index $n_{2c}$ of the intermediate layer 40 at the third wavelength satisfy a relationship of $$n_{2c} \cdot Re[\{\in_M/((n_{2c})^2+\in_M)\}^{1/2}] < n_{1c} \qquad (4).$$

Thus, also when the light emitted from the organic light emitting layer 30 has the multiple peaks, the loss due to the surface plasmon can be reduced at each peak.

Figure 6A:
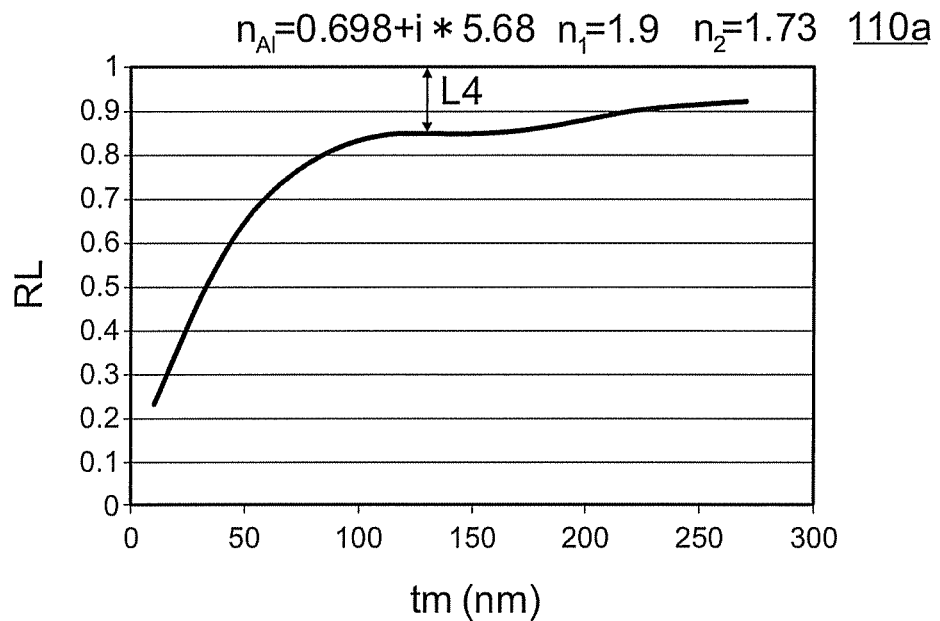
FIG. 6A and FIG. 6B are graphs showing the characteristics of organic electroluminescent devices.
Figure 6B:
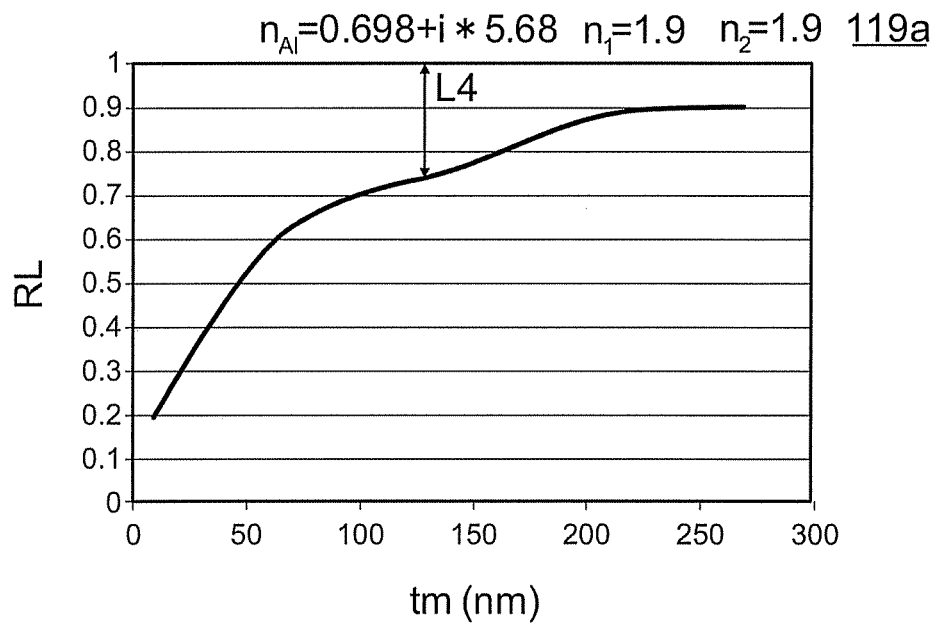

FIG. 6A and FIG. 6B are graphs showing the characteristics of organic electroluminescent devices.

That is, FIG. 6A corresponds to an organic electroluminescent device 110a according to the embodiment, and FIG. 6B corresponds to an organic electroluminescent device 119a of the comparative example. This simulation makes a model of the configuration such that the transparent substrate 50 is provided and the organic light emitting layer 30 contacts the transparent electrode 10 (the transparent electrode side functional layer 31 is not provided).

In the simulation, the refractive index of the transparent substrate 50 is taken as 1.9 (1.9+i*0.001). The refractive index $n_1$ of the organic light emitting layer 30 is taken as 1.9. The refractive index of the metal electrode 20 is taken as 0.698+i*5.68. This value corresponds to the value of aluminum. In the organic electroluminescent device 110a according to the embodiment, the refractive index $n_2$ of the intermediate layer 40 is taken as 1.73. This condition satisfies the above formulae from (1) to (4).

On the other hand, in the organic electroluminescent device 119a of the comparative example, the refractive index $n_2$ of the intermediate layer 40 is taken as 1.9. That is, in the comparative example, the refractive index $n_1$ of the organic light emitting layer 30 is equal to the refractive index $n_2$ of the intermediate layer 40. The distribution ratio RL of light energy has been obtained by changing the thickness tm of the intermediate layer 40. These figures show the loss component L4 absorbed by the metal electrode 20.

As shown in FIG. 6B, in the organic electroluminescent device 119a of the comparative example, the loss component L4 increases drastically in a region of the thickness tm of the intermediate layer 40 less than 200 nm.

On the contrary, as shown in FIG. 6A, in the organic electroluminescent device 110a according to the embodiment, the loss component L4 keeps a relatively small value also in a region of the thickness tm of the intermediate layer 40 less than 200 nm. In the organic electroluminescent device 110a, a loss component L4 less than the loss component L4 in the comparative example is obtained in a region where the thickness tm of the intermediate layer 40 is 60 nm or more and less than 200 nm.

Figure 7A:
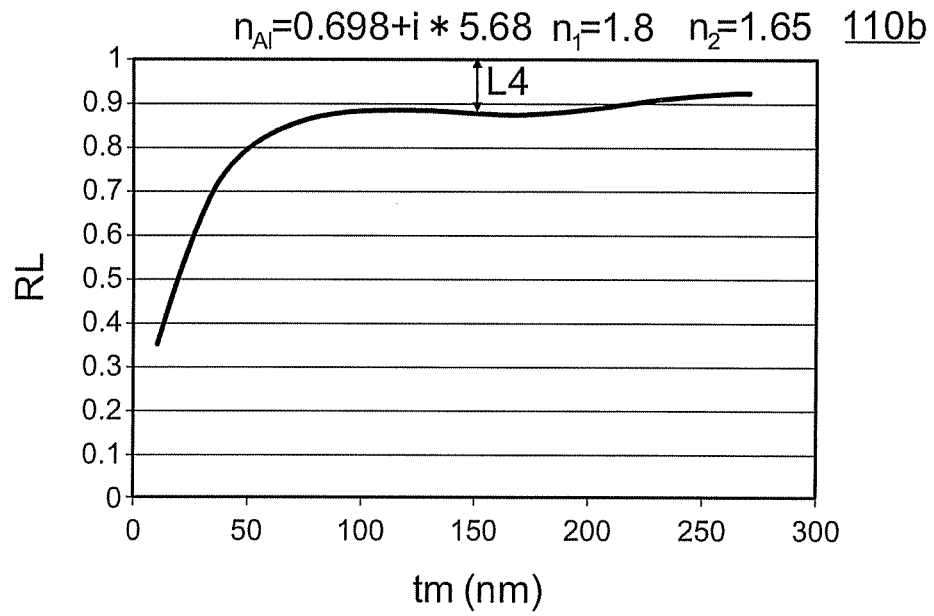
FIG. 7A and FIG. 7B are graphs showing the characteristics of organic electroluminescent devices.
Figure 7B:
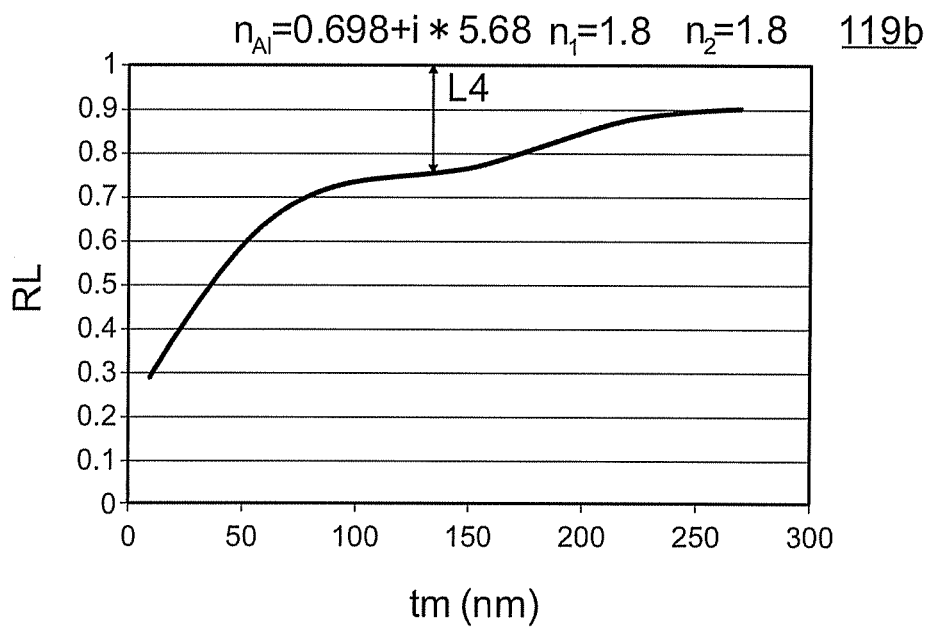

FIG. 7A and FIG. 7B are graphs showing the characteristics of organic electroluminescent devices.

That is, FIG. 7A corresponds to an organic electroluminescent device 110b according to the embodiment, and FIG. 7B corresponds to an organic electroluminescent device 119b of the comparative example. Hereinafter, conditions different from the conditions described with reference to FIG. 6A and FIG. 6B will be described.

In this simulation, the refractive index $n_1$ of the organic light emitting layer 30 is taken as 1.8. In the organic electroluminescent device 110b, the refractive index $n_2$ of the intermediate layer 40 is taken as 1.65. This condition satisfies the above formulae from (1) to (4). On the other hand, in the organic electroluminescent device 119b of the comparative example, the refractive index $n_2$ of the intermediate layer 40 is taken as 1.8.

As shown in FIG. 7B, also in this case, in the organic electroluminescent device 119b of the comparative example, the loss component L4 increases drastically in the region of the thickness tm of the intermediate layer 40 less than 200 nm.

On the contrary, as shown in FIG. 7A, in the organic electroluminescent device 110b according to the embodiment, the loss component L4 keeps a relatively small value also in the region of the thickness tm of the intermediate layer 40 less than 200 nm. In the organic electroluminescent device 110a, a loss component L4 less than the loss component L4 in the comparative example is obtained in a region where the thickness tm of the intermediate layer 40 is 50 nm or more and less than 200 nm.

As shown in FIG. 6A to FIG. 7B, according to the configuration of the embodiment, for example, an efficiency corresponding to the efficiency at 200 nm in the comparative example is obtained at the thickness tm of the intermediate layer 40 of 100 nm. In the region where the thickness tm of the intermediate layer 40 is 60 nm or more and less than 100 nm, the efficiency in the configuration of the embodiment improves by 10% or more in comparison with the efficiency in the comparative example although less than the efficiency at the thickness of tm of 200 nm.

Figure 8A:
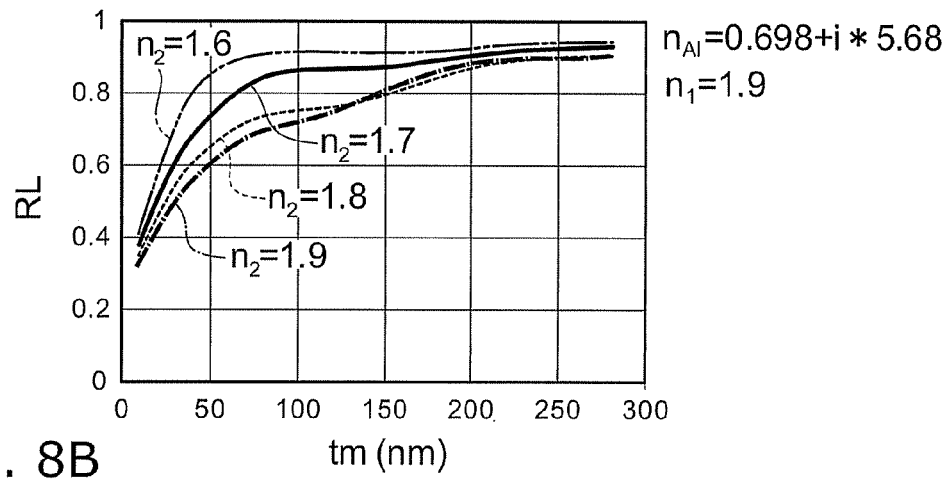
FIG. 8A to FIG. 8C are graphs showing the characteristics of organic electroluminescent devices.
Figure 8B:
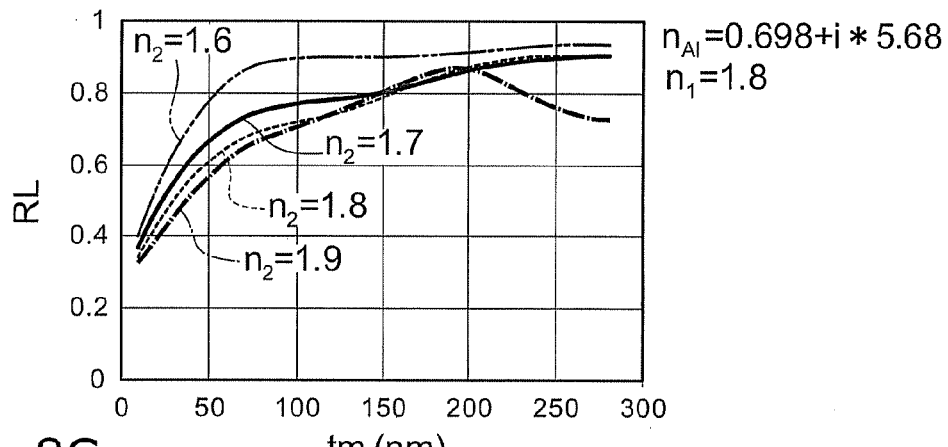
Figure 8C:
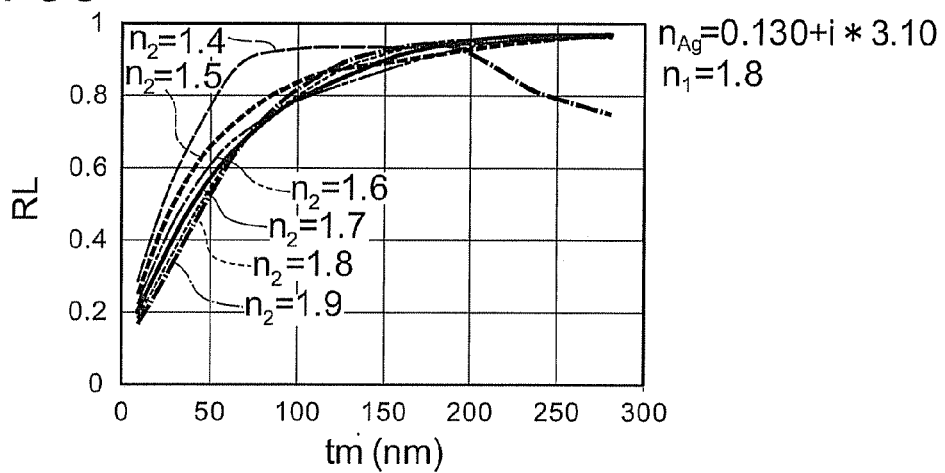

FIG. 8A to FIG. 8C are graphs showing the characteristics of organic electroluminescent devices.

These figures illustrate results of the distribution ratio of light energy obtained by the simulation in which the refractive index $n_2$ of the intermediate layer 40 and the thickness tm of the intermediate layer 40 of the organic electroluminescent device are changed. This simulation makes a model of the configuration of the transparent substrate 50 (refractive index=1.8)/the transparent electrode (refractive index 1.8)/the organic light emitting layer 30 (refractive index $n_1$)/the intermediate layer 40 (refractive index $n_2$, thickness tm)/the metal electrode 20.

In FIG. 8A and FIG. 8B, the refractive index of the metal electrode 20 is 0.698+i*5.68 (corresponding to aluminum), and in FIG. 8C, the refractive index $n_2$ of the metal electrode 20 is 0.130+i*3.10 (corresponding to silver). In FIG. 8A, the refractive index $n_1$ of the organic light emitting layer 30 is 1.9, and in FIG. 8B and FIG. 8C, the refractive index $n_1$ of the organic light emitting layer 30 is 1.8. In this simulation, for simplicity, the refractive index is kept constant without consideration of wavelength dispersion of the refractive index.

As shown in FIG. 8A, in the case where the metal electrode 20 is made of aluminum and the organic light emitting layer 30 is made of a material having the refractive index $n_1$ of 1.9, good characteristics are obtained when the refractive index $n_2$ of the intermediate layer 40 is about 1.8 or less. For example, the formula (1) is satisfied when the refractive index $n_2$ is about 1.8 or less.

As shown in FIG. 8B, in the case where the metal electrode 20 is made of aluminum and the organic light emitting layer 30 is made of a material having the refractive index $n_1$ of 1.8, good characteristics are obtained when the refractive index $n_2$ of the intermediate layer 40 is about 1.7 or less. For example, the formula (1) is satisfied when the refractive index $n_2$ is about 1.71 or less.

As shown in FIG. 8C, in the case where the metal electrode 20 is made of silver and the organic light emitting layer 30 is made of a material having the refractive index $n_1$ of 1.8, good characteristics are obtained when the refractive index $n_2$ of the intermediate layer 40 is about 1.6 or less. For example, the formula (1) is satisfied when the refractive index $n_2$ is about 1.55 or less.

In this manner, for example, the relationship between the refractive index of the organic light emitting layer 30 and the refractive index of the intermediate layer 40 is adequately set depending on the refractive index of the metal electrode 20 (namely, depending on the material of the metal electrode 20).

In the case where the metal electrode is made of silver, the adequate refractive index of the intermediate layer 40 is lower than the case where the metal electrode is made of aluminum. This is because the value of Re[A1] in silver is larger than the value of Re[A1] in aluminum.

In the embodiment, when specifically practical aluminum is used for the metal electrode 20 from the viewpoint of cost, specifically high outcoupling efficiency is achieved by adopting the above conditions.

In the embodiment, it is notable that the refractive index $n_1$ of the organic light emitting layer 30 to the visible light is 1.8 or more and 2.2 or less. Thus, the practical organic light emitting layer 30 having the adequate emission characteristics and the stable reliability is achieved.

At this time, it is notable that the refractive index $n_2$ of the intermediate layer 40 to the visible light is 1.5 or more and 1.8 or less. Then, the condition of the refractive index $n_1$>the refractive index $n_2$ is satisfied. Thus, the organic electroluminescent device having high outcoupling efficiency is achieved.

FIG. 9A to FIG. 9E are schematic sectional views showing another organic electroluminescent device according to the embodiment.

As shown in FIG. 9A, another organic electroluminescent device 111a according to the embodiment, further includes the transparent substrate 50 and an optical layer 68 in addition to the transparent electrode 10, the metal electrode 20, the organic light emitting layer 30 and the intermediate layer 40.

The transparent substrate 50 is transmissive with respect to the visible light. The transparent electrode 10 is disposed between the transparent substrate 50 and the organic light emitting layer 30.

The optical layer 68 is provided between the transparent substrate 50 and the transparent electrode 10. The optical layer 68 includes a high refractive index layer 60. The high refractive index layer 60 contacts the transparent substrate 50 and the transparent electrode 10. The high refractive layer 60 has a refractive index higher than the refractive index of the transparent substrate 50. The refractive index of the high refractive index layer 60 is notable to be approximately the same as the refractive index of the transparent electrode 10 and the refractive index of the organic light emitting layer 30. For example, a difference between the refractive index of the high refractive index layer 60 and the refractive index of the transparent electrode 10 and a difference between the refractive index of the high refractive index layer 60 and the refractive index of the organic light emitting layer 30 are smaller than a difference between the high refractive index layer 60 and the refractive index of the transparent substrate 50. The high refractive index layer 60 is transmissive with respect to the visible light.

In this example, irregularities are provided on a surface of the transparent substrate 50 (face on an opposite side to the high refractive index layer 60). The irregularities are various in form, for example, in lens shape, in groove shape, in polygonal pyramid shape, and in frustum of a polygonal pyramid. The irregularities cause a traveling direction of light LL to change.

In this example, the optical layer 68 further includes a low refractive index layer 60a adjacent to the high refractive index layer 60. The refractive index of the low refractive index layer 60a is lower than the refractive index of the high refractive index layer 60. The refractive index of the low refractive index layer 60a is, for example, approximately same as the refractive index of the transparent substrate 50. The low refractive index layer 60a may be, for example, an air layer (including particles involving air). Thus, the traveling direction of the light changes in the optical layer 68. Specifically, the traveling direction of the light changes at an interface between the high refractive layer 60 and the low refractive layer 60a.

Thus, the light LL emitted from the organic light emitting layer 30 is easy to enter the transparent substrate 50. That is, for example, the thin film layer mode component L3 can be reduced. The light LL can be extracted outside effectively.

As shown in FIG. 9B, in another organic electroluminescent device 111b according to the embodiment, a scattering high refractive index layer 61 is used as the optical layer 68 between the transparent substrate 50 and the transparent electrode 10. The refractive index of the high refractive index layer 61 is higher than the refractive index of the transparent substrate 50. The refractive index of the high refractive index layer 61 is notable to be approximately the same as the refractive index of the transparent electrode 10 and the refractive index of the organic light emitting layer 30. Also in this case, the optical layer 68 (scattering high refractive index layer 61) changes the traveling direction of the light.

As shown in FIG. 9C, in another organic electroluminescent device 111c according to the embodiment, an interface between the optical layer 68 (high refractive index layer 60) and the transparent substrate 50 has irregularities. In this example, the traveling direction of the light entering the interface between the optical layer 68 (high refractive index layer 60) and the transparent substrate 50 changes.

As shown in FIG. 9D, in another organic electroluminescent device 111d according to the embodiment, a material having a relatively high refractive index is used as the transparent substrate 50. The refractive index of the transparent substrate 50 is, for example, approximately 1.6 or more and 2.1 or less. The refractive index of the transparent substrate 50 is notable to be approximately the same as the refractive index of the transparent electrode 10 and the refractive index of the organic light emitting layer 30. Irregularities are provided on the surface of the transparent substrate 50.

As shown in FIG. 9E, also in another organic electroluminescent device 111d according to the embodiment, a material having a relatively high refractive index is used as the transparent substrate 50. A high refractive index layer 65 is provided on the surface of the transparent substrate 50 (face on an opposite side to the high refractive index layer 60). The refractive index of the high refractive index layer 65 is approximately the same as the refractive index of the transparent substrate 50. The high refractive index layer 65 functions as a scattering layer.

Also in the above organic electroluminescent devices 111b to 111e, the light LL emitted from the organic light emitting layer 30 is easy to enter the transparent substrate 50 and the light is extracted outside effectively.

In the embodiment, the loss component L4 absorbed by the metal electrode 20 can be reduced. Therefore, specifically a high outcoupling efficiency is achieved by further reducing the thin film layer mode component L3.

Use of the high refractive index layer 60 broadens, for example, a selection range for the transparent substrate 50. Thus, a substrate having high productivity and low cost can be used as the transparent substrate 50, resulting in high practicability.

According to the embodiment, without having to set the thickness of the intermediate layer 40 to be 200 nm or more as before, practical reduction of the surface plasmon loss can be reduced with the thickness less than 200 nm. Thus, a material usage and a tact time for manufacturing can be suppressed, and a device with low cost and having a high emission efficiency and a high power efficiency can be realized.

The organic electroluminescent device according to the embodiment can be applied to, for example, a planar light source (a kind of an illumination apparatus) or the like used for an illumination apparatus and a display or the like.

Figure 10:
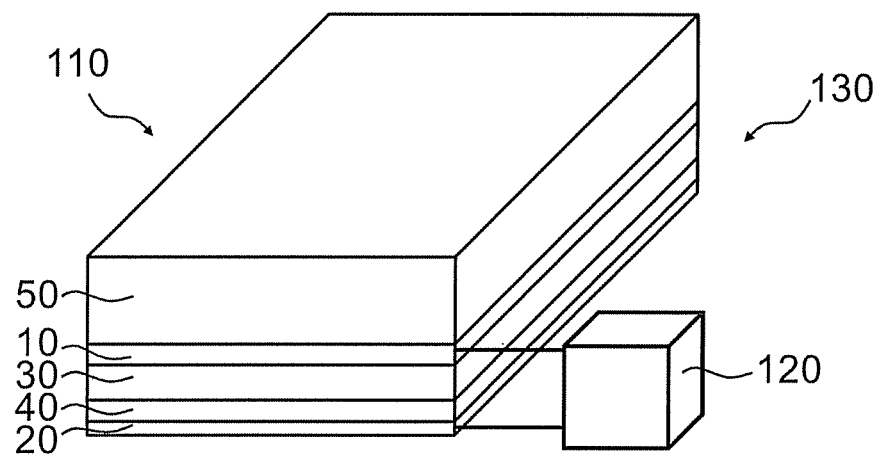
FIG. 10 is a schematic perspective view showing an illumination apparatus according to the embodiment.

FIG. 10 is a schematic perspective view showing an illumination apparatus according to the embodiment.

As shown in FIG. 10, an illumination apparatus 130 according to the embodiment includes the organic electroluminescent device and a power supply 120. The organic electroluminescent device can be made of an arbitrary device according to the embodiment. This figure illustrates the case where the organic electroluminescent device 110 is used.

As described previously, the organic electroluminescent device 110 includes the transparent electrode 10, the metal electrode 20, the organic light emitting layer 30 and the intermediate layer 40. The power supply 120 is connected to the transparent electrode 10 and the metal electrode 20. The power supply 120 supplies a current flowing the organic light emitting layer 30.

Also in this case, the thickness tm of the intermediate layer 40 is set 60 nm or more and less than 200 nm, and the refractive index $n_1$ of the organic light emitting layer 30 to the visible light is set higher than the refractive index $n_2$ of the intermediate layer 40 to the visible light. For example, the above formulae (1) to (4) are satisfied. Thus, an illumination apparatus based on the organic electroluminescent device having a high outcoupling efficiency can be provided.

According to the embodiment, the organic electroluminescent device and the illumination apparatus having the high the outcoupling efficiency are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the organic electroluminescent device such as the transparent electrode, the metal electrode, the organic light emitting layer, the intermediate layer, the transparent substrate and the high refractive index layer, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all organic electroluminescent devices and illumination apparatuses practicable by an appropriate design modification by one skilled in the art based on the organic electroluminescent devices and the illumination apparatuses described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An organic electroluminescent device comprising:
a transparent electrode transmissive with respect to visible light;
a metal electrode reflective with respect to the visible light;
an organic light emitting layer provided between the transparent electrode and the metal electrode and configured to emit white color light including two peaks, wherein each of the two peaks corresponds to a different wavelength component of the visible light; and
an intermediate layer contacting the metal electrode and the organic light emitting layer between the organic light emitting layer and the metal electrode and transmissive with respect to the visible light, a thickness of the intermediate layer being 60 nanometers or more and less than 200 nanometers, and a refractive index of the organic light emitting layer to the visible light being higher than a refractive index of the intermediate layer to the visible light,
wherein a refractive index of the organic light emitting layer is higher than a refractive index of the intermediate layer for each of the different wavelengths corresponding to each of the two peaks.

2. The device according to claim 1, wherein
the white color light emitted from the organic light emitting layer further comprises a third peak corresponding to a third wavelength of the visible light, wherein the third wavelength is different from the different wavelengths corresponding to each of the two peaks, and
a refractive index of the organic light emitting layer at the third wavelength is higher than a refractive index of the intermediate layer at the third wavelength.

3. The device according to claim 1, wherein
a complex dielectric constant $\in_M$ of the metal electrode, a refractive index $n_1$ of the organic light emitting layer to the visible light, and a refractive index $n_2$ of the intermediate layer to the visible light satisfy a relationship of $$n_2 \cdot Re[\{\in_M/((n_2)^2 + \in_M)\}^{1/2}] < n_1 \quad (1).$$

4. The device according to claim 1, wherein
a complex dielectric constant $\in_M$ of the metal electrode, a refractive index $n_{1a}$ of the organic light emitting layer at a first wavelength, being one of the wavelengths, and a refractive index $n_{2a}$ of the intermediate layer at the first wavelength satisfy a relationship of $$n_{2a} \cdot Re[\{\in_M/((n_{2a})^2 + \in_M)\}^{1/2}] < n_{1a} \quad (2), \text{ and}$$

the complex dielectric constant $\in_M$, a refractive index $n_{1b}$ of the organic light emitting layer at a second wavelength, being another one of the wavelengths, and a refractive index $n_{2b}$ of the intermediate layer at the second wavelength satisfy a relationship of $$n_{2b} \cdot Re[\{\in_M/((n_{2b})^2 + \in_M)\}^{1/2}] < n_{1b} \quad (3).$$

5. The device according to claim 1, wherein
the metal electrode includes at least one of aluminum and silver.

6. The device according to claim 1, wherein
a refractive index $n_1$ of the organic light emitting layer to the visible light is 1.8 or more and 2.2 or less, and
a refractive index $n_2$ of the intermediate layer to the visible light is 1.5 or more and less than 1.8.

7. The device according to claim 1, wherein
the intermediate layer includes an organic material.

8. The device according to claim 1, wherein
the intermediate layer includes a layer functioning as an electron transport layer.

9. The device according to claim 1, wherein
the transparent electrode includes oxide including at least one element selected from the group consisting of In, Sn, Zn and Ti.

10. The device according to claim 1, further comprising:
a transparent substrate transmissive with respect to the visible light, and the transparent electrode being disposed between the transparent substrate and the organic light emitting layer; and
an optical layer provided between the transparent substrate and the transparent electrode,
the optical layer includes a high refractive index layer contacting the transparent substrate and the transparent electrode, the high refractive index layer having a refractive index higher than a refractive index of the transparent substrate and being transmissive with respect to the visible light, and
a traveling direction of light entering the optical layer changing, or a traveling direction of light entering an interface between the optical layer and the transparent substrate changing.

11. The device according to claim 10, wherein
a surface of the transparent electrode has irregularities to change the traveling direction of the light.

12. The device according to claim 1, further comprising:
a transparent substrate transmissive with respect to the visible light, and the transparent electrode being disposed between the transparent substrate and the metal electrode, the transparent substrate having a first surface and a second surface, the first surface facing to the transparent electrode, the second surface being opposite to the first surface, the second surface having irregularities changing a traveling direction of light.

13. The device according to claim 12, further comprising:
an optical layer provided between the transparent substrate and the transparent electrode, wherein
the optical layer includes a high refractive index layer physically contacting the transparent substrate and the transparent electrode, the high refractive index layer having a refractive index higher than a refractive index of the transparent substrate and being transmissive with respect to the visible light, and
a traveling direction of light entering the optical layer changing, or a traveling direction of light entering an interface between the optical layer and the transparent substrate changing.

14. The device according to claim 13, wherein the optical layer further includes a low refractive index layer adjacent to the high refractive index layer,
a refractive index of the low refractive index layer is lower than the refractive index of the high refractive index layer, 15. The device according to claim 1, further comprising:
a scattering layer scattering light, and the transparent electrode being disposed between the scattering layer and the metal electrode.

16. The device according to claim 15, further comprising:
a transparent substrate transmissive with respect to the visible light, wherein the transparent substrate is disposed between the scattering layer and the transparent electrode.

17. The device according to claim 15, further comprising:
a transparent substrate transmissive with respect to the visible light, wherein the scattering layer is disposed between the transparent substrate and the transparent electrode.

18. The device according to claim 1, further comprising:
a transparent substrate transmissive with respect to the visible light, and the transparent electrode being disposed between the transparent substrate and the metal electrode; and
an optical layer provided between the transparent substrate and the transparent electrode, wherein the optical layer includes a high refractive index layer physically contacting the transparent substrate and the transparent electrode, the high refractive index layer having a refractive index higher than a refractive index of the transparent substrate and being transmissive with respect to the visible light.

19. The device according to claim 18, wherein the optical layer make a traveling direction of light entering the optical layer to change.

20. The device according to claim 19, wherein the optical layer further includes a low refractive index layer adjacent to the high refractive index layer,
a refractive index of the low refractive index layer is lower than the refractive index of the high refractive index layer.

21. The device according to claim 18, wherein the high refractive index layer scatters light.

22. The device according to claim 18, wherein the optical layer physically contacts the transparent substrate,
an interface between the optical layer and the transparent substrate has irregularities,
a traveling direction of light entering an interface between the optical layer and the transparent substrate changes.

23. An illumination apparatus comprising:
an organic electroluminescent device including:
a transparent electrode transmissive with respect to visible light;
a metal electrode reflective with respect to the visible light;
an organic light emitting layer provided between the transparent electrode and the metal electrode and configured to emit white color light comprising a first peak corresponding to a first wavelength component of the visible light and a second peak corresponding to a second wavelength component of the visible light, wherein the first wavelength component and the second wavelength component are different;
an intermediate layer contacting the metal electrode and the organic light emitting layer between the organic light emitting layer and the metal electrode and transmissive with respect to the visible light; and
a power supply connected to the transparent electrode and the metal electrode and configured to supply a current flowing the organic light emitting layer, wherein
a thickness of the intermediate layer being 60 nanometers or more and less than 200 nanometers,
a refractive index of the organic light emitting layer to the visible light being higher than a refractive index of the intermediate layer to the visible light,
a refractive index of the organic light emitting layer at the first wavelength component is higher than a refractive index of the intermediate layer at the first wavelength, and
a refractive index of the organic light emitting layer at the second wavelength component is higher than a refractive index of the intermediate layer at the second wavelength.

24. The apparatus according to claim 23, wherein
a complex dielectric constant $\epsilon_M$ of the metal electrode, a refractive index $n_1$ of the organic light emitting layer to the visible light, and a refractive index $n_2$ of the intermediate layer to the visible light satisfy a relationship of $$n_2 \cdot Re[\{\epsilon_M/((n_2)^2+\epsilon_M)\}^{1/2}] < n_1 \qquad (1),$$

wherein $Re[\{\epsilon_M/((n_2)^2+\epsilon_M)\}^{1/2}]$ is the real part of $\{\epsilon_M/((n_2)^2+\epsilon_M)\}^{1/2}$.

25. The apparatus according to claim 23, wherein
a complex dielectric constant $\epsilon_M$ of the metal electrode, a refractive index $n_{1a}$ of the organic light emitting layer at a first wavelength, being one of the wavelengths, and a refractive index $n_{2a}$ of the intermediate layer at the first wavelength component satisfy a relationship of $$n_{2a} \cdot Re[\{\epsilon_M/((n_{2a})^2+\epsilon_M)\}^{1/2}] < n_{1a} \qquad (2), \text{ and}$$

the complex dielectric constant $\epsilon_M$, a refractive index $n_{1b}$ of the organic light emitting layer at a second wavelength, being another one of the wavelengths, and a refractive index $n_{2b}$ of the intermediate layer at the second wavelength component satisfy a relationship of $$n_{2b} \cdot Re[\{\epsilon_M/((n_{2b})^2+\epsilon_M)\}^{1/2}] < n_{1b} \qquad (3)$$

wherein $Re[\{\epsilon_M/((n_{2a})^2+\epsilon_M)\}^{1/2}]$ is the real part of $\{\epsilon_M/((n_{2a})^2+\epsilon_M)\}^{1/2}$ and $Re[\{\epsilon_M/((n_{2b})^2+\epsilon_M)\}^{1/2}]$ is the real part of $\{\epsilon_M/((n_{2b})^2+\epsilon_M)\}^{1/2}$.

26. The apparatus according to claim 23, wherein
the metal electrode includes at least one of aluminum and silver.

27. The apparatus according to claim 23, wherein
a refractive index $n_1$ of the organic light emitting layer to the visible light is 1.8 or more and 2.2 or less, and
a refractive index $n_2$ of the intermediate layer to the visible light is 1.5 or more and less than 1.8.

28. The apparatus according to claim 23, wherein
the intermediate layer includes an organic material.

29. The apparatus according to claim 23, wherein
the transparent electrode includes an oxide including at least one element selected from the group consisting of In, Sn, Zn and Ti.

30. The apparatus according to claim 23, further comprising:
a transparent substrate transmissive with respect to the visible light, and the transparent electrode being disposed between the transparent substrate and the metal electrode, the transparent substrate having a first surface and a second surface, the first surface facing to the transparent electrode, the second surface being opposite to the first surface, the second surface having irregularities changing a traveling direction of light.

31. The apparatus according to claim 23, further comprising:
a scattering layer scattering light, and the transparent electrode being disposed between the scattering layer and the metal electrode.

32. The apparatus according to claim 23, further comprising:
- a transparent substrate transmissive with respect to the visible light, and the transparent electrode being disposed between the transparent substrate and the metal electrode; and
- an optical layer provided between the transparent substrate and the transparent electrode, wherein the optical layer includes a high refractive index layer physically contacting the transparent substrate and the transparent electrode, the high refractive index layer having a refractive index higher than a refractive index of the transparent substrate and being transmissive with respect to the visible light.

* * * * *